United States Patent [19]

Willems et al.

[11] Patent Number: 5,168,242

[45] Date of Patent: Dec. 1, 1992

[54] ACTIVE-TYPE BROADBAND POWER DIVIDER

[75] Inventors: David A. Willems, Salem; Victor E. Steel, Troutville, both of Va.

[73] Assignee: ITT Corporation, New York, N.Y.

[21] Appl. No.: 794,968

[22] Filed: Nov. 20, 1991

[51] Int. Cl.⁵ ............................................. H03F 3/60
[52] U.S. Cl. ..................................... 330/54; 330/286
[58] Field of Search .......... 330/53, 54, 124 D, 124 R, 330/277, 286, 295, 302, 306

[56] References Cited

U.S. PATENT DOCUMENTS 4,973,918 11/1990 Schindler ........................ 330/54 X Primary Examiner—Steven Mottola
Attorney, Agent, or Firm—Arthur L. Plevy

[57] ABSTRACT

An active-type broadband power divider has a pair of distributed amplifiers which are coupled together by a distributed capacitive coupling to provide a predetermined phase shift between respective output signals thereof. The distributed amplifiers are in the form of a row of three-terminal transistors having their gates and drains connected to gate and drain lines. The gate and drain lines are artificial transmission lines. By distributing the capacitive coupling between the gate and/or drain lines, a constant 90 degree phase shift is obtained over the entire bandwidth of the artificial transmission lines. For a 180 degree phase shift, a third distributed amplifier is provided with distributed capacitive coupling between its gate or drain line and that of the second distributed amplifier.

19 Claims, 3 Drawing Sheets

ACTIVE-TYPE BROADBAND POWER DIVIDER

FIELD OF INVENTION

The present invention relates to a power divider circuit, and particularly, to one capable of operation over a broad bandwidth with a 90 degree, 180 degree, or multiples thereof, phase difference between the divided signals.

BACKGROUND OF INVENTION

A power divider is a commonly used circuit in electronics. It is used to split a signal into a pair of signals identical to the original. Often, it is advantageous to introduce a phase shift between the divided signals. For example, phase shifts of 90 and 180 degrees are required for circuits such as phase shifters, vector modulators, mixers, and other networks. A major problem at RF and microwave frequencies is constructing a power divider that can maintain a constant 90 or 180 degrees of phase difference between the pair of divided signals over a broad bandwidth.

Power dividers are of generally two classes: passive and active. Passive power dividers can be designed to work over octave bandwidths with acceptable phase and amplitude control. However, one of the drawbacks of passive divider circuits is signal loss. Additionally, the phase and amplitude balance tends to be sensitive to a match of input and output impedances.

Active power dividers, which use a three-terminal device such as a transistor for amplification, are less sensitive to input and output matches and can provide controllable gain. This type of power divider has been used to provide a signal split with the output signals phased equally.

SUMMARY OF INVENTION

A principal object of the present invention is to provide an active-type broadband power divider which can provide divided output signals with a constant 90 degrees, 180 degrees, or multiples thereof phase difference over a decade or greater bandwidths.

In accordance with the invention, an active-type broadband power divider has a pair of distributed amplifiers which are coupled together with distributed capacitive coupling to provide a predetermined phase shift between respective output signals of the distributed amplifiers. The distributed amplifiers are each implemented in the form of a row of three-terminal transistors having their gates and drains connected to gate and drain lines. The gate and drain lines are artificial transmission lines formed by series inductors and shunt capacitance, the latter being realized through the intrinsic capacitance of the transistors.

The capacitive coupling is arranged between gate and/or drain lines of the respective distributed amplifiers. By distributing the capacitive coupling between the gate and/or drain lines, a constant 90 degree phase shift can be obtained over the entire bandwidth of the artificial transmission lines. The capacitive coupling can be realized either by discrete capacitors or by a capacitive coupling between the transmission lines. For a 180 degree phase shift, a third distributed amplifier is provided with distributed capacitive coupling between its gate or drain line and that of the second distributed amplifier.

BRIEF DESCRIPTION OF DRAWINGS

The above objects and further features and advantages of the invention are described in detail below in conjunction with the drawings, of which.

DETAILED DESCRIPTION OF PREFERRED EMBODIMENTS

Figure 1:
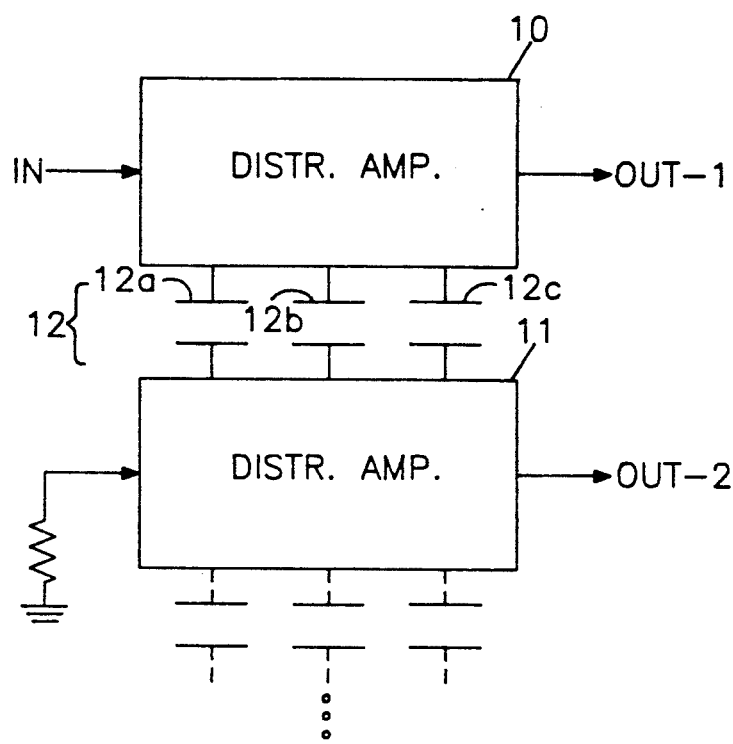
FIG. 1 is a schematic diagram of the overall concept of the present invention.

Referring to FIG. 1, the present invention employs at least a pair of distributed amplifiers 10, 11 which are coupled together with a distributed capacitive coupling, indicated by a row 12 of capacitances 12a, 12b, 12c. An input signal is provided to one of the distributed amplifiers 10, and respective output signals OUT-1 and OUT-2 are obtained which have a predetermined phase shift between them. The dotted portion indicates possible other stages of distributed amplifiers.

Figure 2:
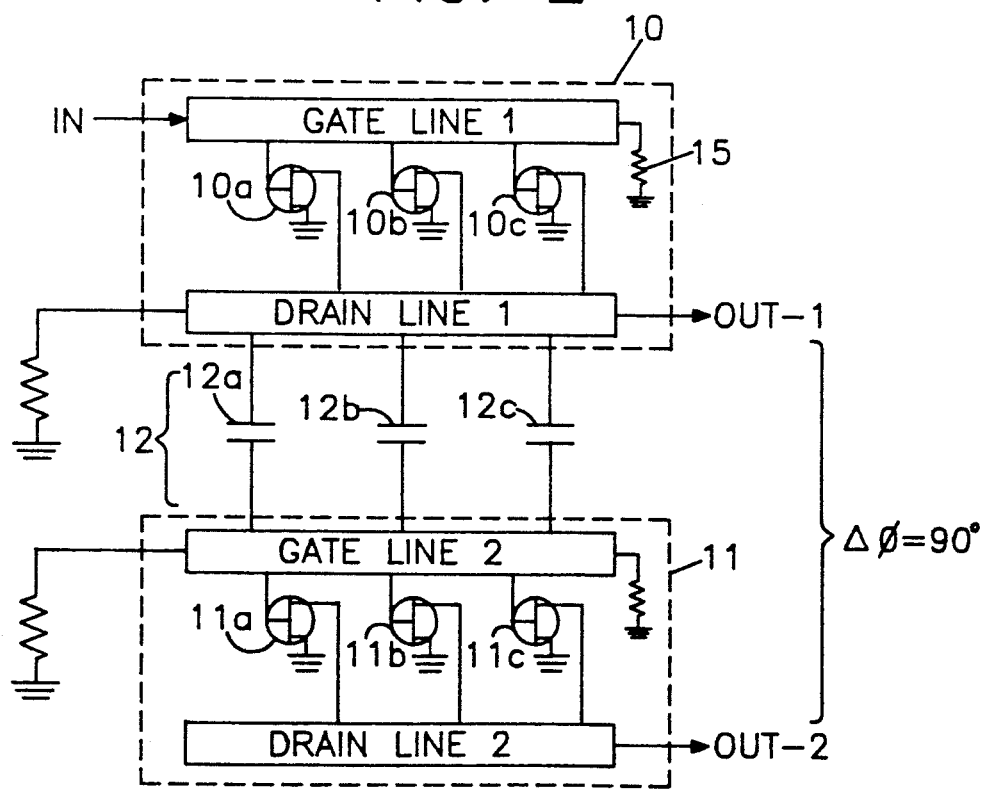
FIG. 2 is a diagram of one embodiment of the active-type broadband power divider having two distributed amplifiers with gate and drain lines capacitively coupled to provide divided output signals with a 90 degree phase shift.

Referring to one embodiment shown in FIG. 2, the pair of distributed amplifiers 10, 11 are preferably implemented in the form of respective rows of three-terminal transistors 10a, 10b, 10c and 11a, 11b, 11c. Such transistors are preferably implemented as field effect transistors (FETs). In each distributed amplifier, the transistors have their gate terminals connected to a gate line, i.e., Gate Line 1 and Gate Line 2, respectively, and their drain terminals connected to a drain line, i.e., Drain Line 1 and Drain Line 2, respectively. The gate lines as Gate Line 1 and Gate Line 2 are typically terminated in a resistor such as resistor 15 for Gate Line 1. The resistor 15 is directed from the gate line to the point of reference potential as ground. The gate and drain lines are artificial transmission lines formed by series inductors and shunt capacitance, the latter being realized through the intrinsic capacitance of the transistors. By distributing the capacitive coupling between the gate and/or drain lines of the distributed amplifiers, a constant 90 degree phase shift is obtained over the entire bandwidth of the artificial transmission lines. The capacitive coupling can be realized either by discrete capacitors or by a capacitive coupling between the transmission lines.

In the embodiment of FIG. 2, the distributed capacitive coupling 12 couples Drain Line 1 of the distributed amplifier 10 and Gate Line 1 of the distributed amplifier 11. Gate Line 1 receives an input signal at an input end and has its output end terminated through a resistor to ground. Drain Line 1 has an input end terminate through a resistor to ground and an output end providing the output signal OUT-1. Gate Line 2 has both ends terminated through resistors to ground. Drain Line 2 has an input end terminated through a resistor to ground and an output end providing the output signal OUT-2. Due to the capacitive coupling between the distributed amplifiers 10, 11, the output signals OUT-1 and OUT-2 are in quadrature, i.e., have a 90 degree phase difference between them.

Figure 3:
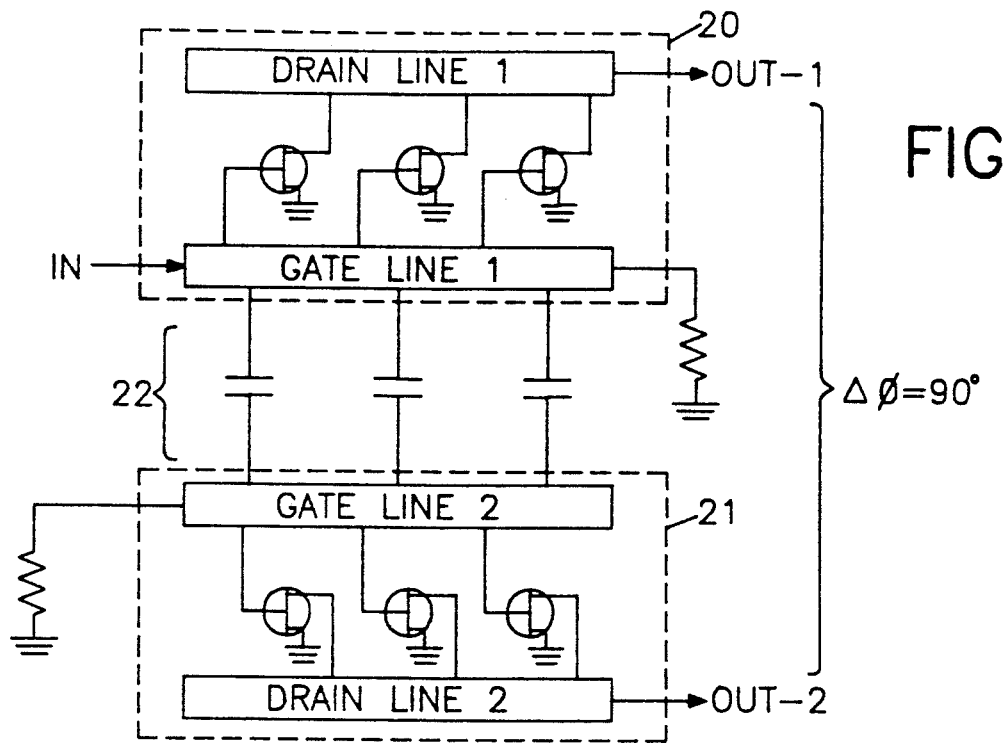
FIG. 3 shows another embodiment of the active-type broadband power divider having two distributed amplifiers with respective gate lines capacitively coupled to provide divided output signals with a 90 degree phase shift.

In FIG. 3, an alternate embodiment of the two-amplifier quadrature power divider has the capacitive coupling 22 arranged between Gate Line 1 of the distributed amplifier 20 and Gate Line 2 of the distributed amplifier 21, and the output signals OUT-1 and OUT-2 are provided from Drain Lines 1 and 2, respectively, with 90 degrees of phase difference.

Figure 4:
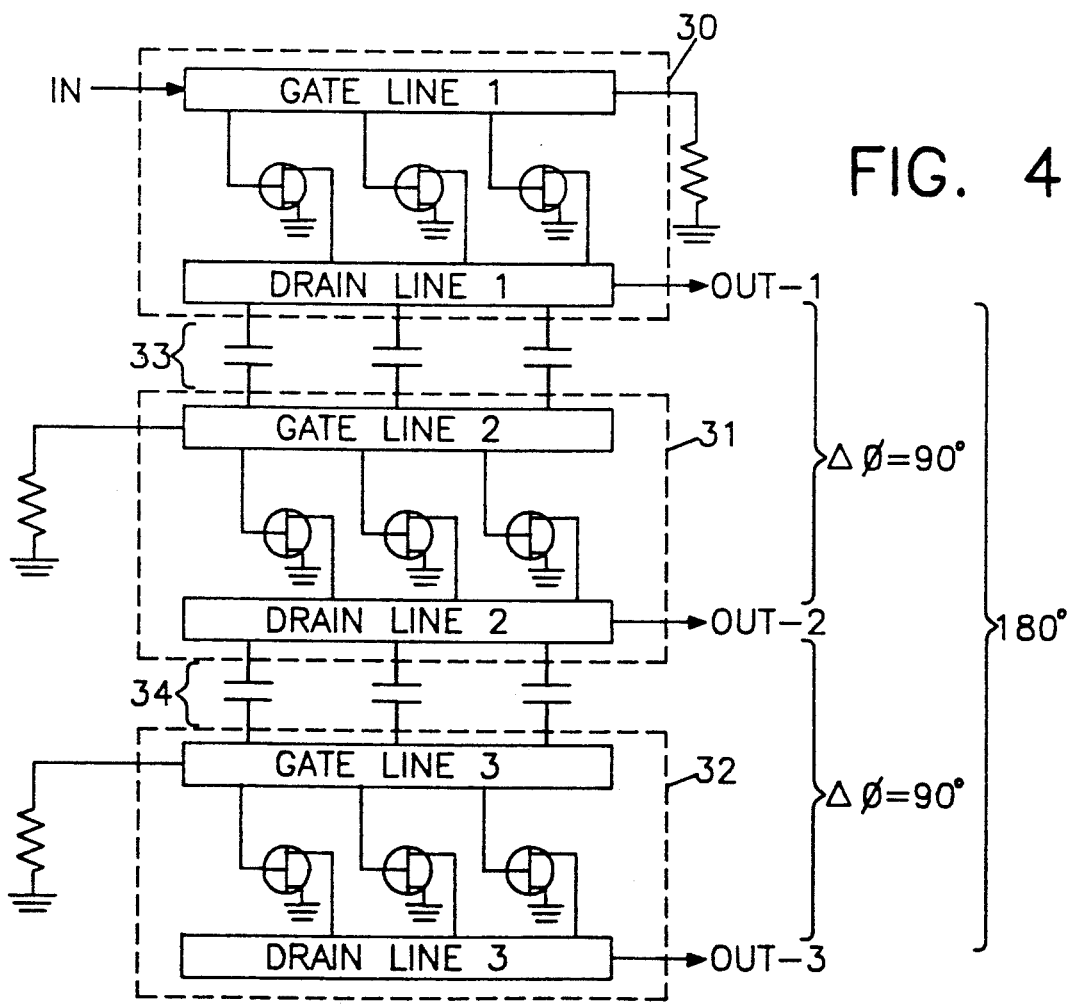
FIG. 4 shows a further embodiment of the active-type broadband power divider having three distributed amplifiers with gate and drain lines capacitively coupled to provide divided output signals with a 180 degree phase shift.

In FIG. 4, a further embodiment employs three distributed amplifiers 30, 31, 32. A capacitive coupling 33 is arranged between the drain and gate lines of the first and second amplifiers 30 and 31, and a capacitive coupling 34 is arranged between the drain and gate lines of the second and third amplifiers 31 and 32. Output signals OUT-1, OUT-2, AND OUT-3 are obtained from Drain Lines 1, 2, and 3, respectively. Each pair of distributed amplifiers has 90 degrees of phase difference between their output signals, and the combined effect of 180 degrees of phase difference is obtained between output signals OUT-1 and OUT-3.

Figure 5:
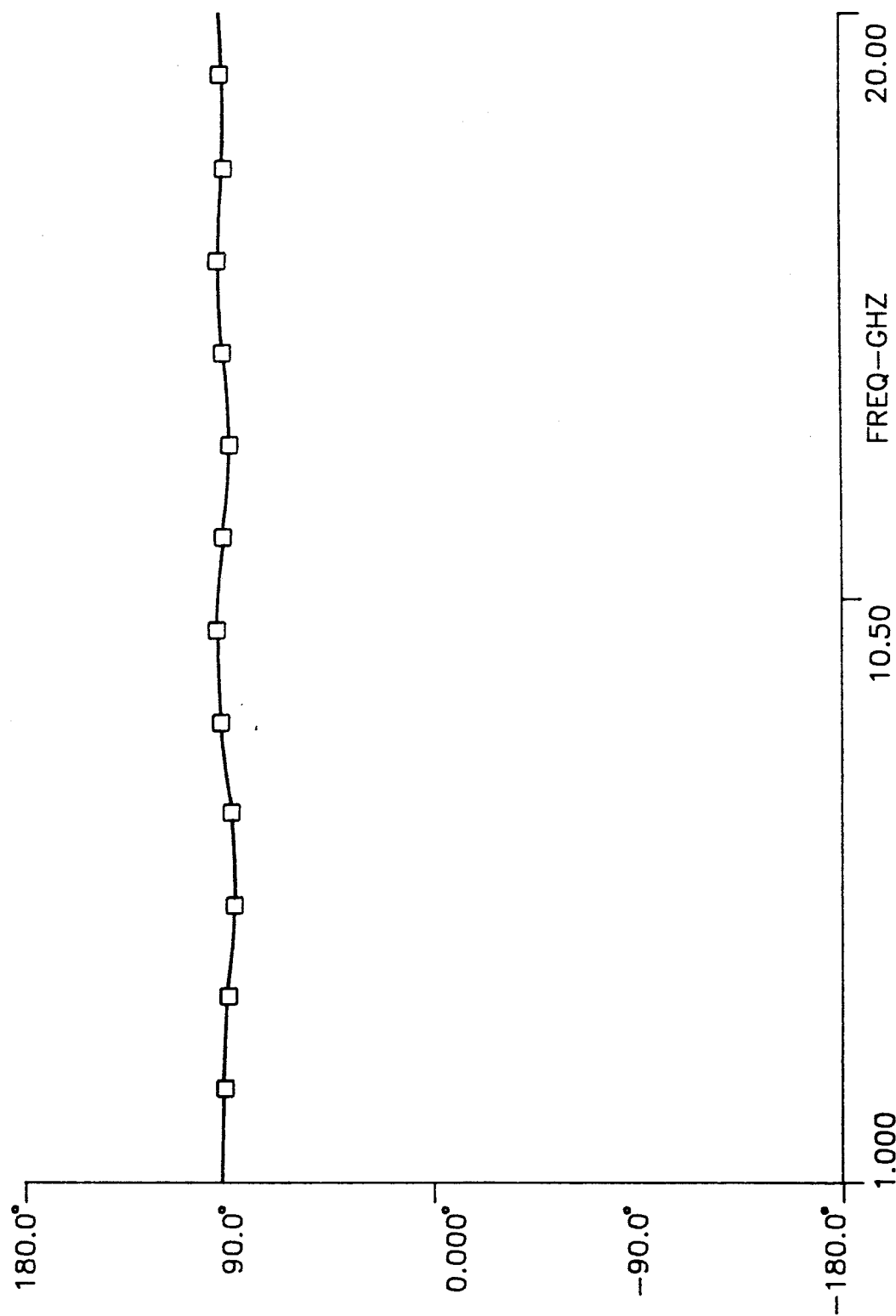
FIG. 5 is a graph showing the phase shift characteristic over a decade bandwidth of 1.0 to 20.0 GHz obtained in the present invention.

In FIG. 5, a graph obtained by computer simulation of the quadrature power divider circuit illustrates the phase shift characteristic between the divided output signals. The graph shows that a phase shift error of less than 5% is obtained over a broad bandwidth from 1.0 to 20.0 GHz (20:1 bandwidth). By using transistors with lower intrinsic capacitance, thus increasing the cutoff frequency of the artificial transmission lines, the desired characteristic can be expanded even further over a greater bandwidth.

The active-type broadband power divider circuit of the present invention could replace many types of passive power dividers in current use, both of quadrature phase and of opposing phase (baluns). This circuit is also highly compatible with MMIC technology, and will enable the use of very compact, high performance, broadband power dividers.

The specific embodiments of the invention described herein are intended to be illustrative only, and many other variations and modifications may be made thereto in accordance with the principles of the invention. All such embodiments and variations and modifications thereof are considered to be within the scope of the invention, as defined in the following claims.

We claim:

1. An active-type broadband power divider comprising:
   a pair of distributed amplifiers which are coupled together by a distributed capacitive coupling to provide a predetermined phase shift between respective output signals thereof,
   wherein said distributed amplifiers are each implemented in the form of a row of three-terminal transistors having their gate terminals connected to a gate line and their drain terminals connected to a drain line, and
   wherein said distributed capacitive coupling is arranged between the drain line of a first one of said pair of distributed amplifiers and the gate line of a second one of said pair of distributed amplifiers.

2. An active-type broadband power divider according to claim 1, wherein the output signals taken from the drain lines of the respective distributed amplifiers have a 90 degree phase difference between them.

3. An active-type broadband power divider according to claim 1, further comprising a third distributed amplifier of like construction as said pair of distributed amplifiers, wherein a second distributed capacitive coupling couples a drain line of the second distributed amplifier to a gate line of the third distributed amplifier, and the output signals taken from the drain line of the first distributed amplifier and from the drain line of the third distributed amplifier have a 180 degree phase difference between them.

4. An active-type broadband power divider according to claim 1, wherein said power divider has a quadrature phase shift characteristic between output signals with a phase shift error of less than 5% obtained over a broad bandwidth.

5. An active-type broadband power divider according to claim 1, wherein said power divider has a quadrature phase shift characteristic between output signals which is substantially even over a decade bandwidth.

6. An active-type broadband power divider according to claim 1, wherein said distributed capacitive coupling is obtained by discrete capacitors.

7. An active-type broadband power divider according to claim 1, wherein said distributed capacitive coupling is obtained by a capacitive coupling between the transmission lines.

8. A circuit for splitting an input signal into output signals having a predetermined phase shift between them comprising:
   a pair of distributed amplifiers which are coupled together by a distributed capacitive coupling,
   wherein said distributed amplifiers are each implemented in the form of a row of three-terminal transistors having their gate terminals connected to a gate line and their drain terminals connected to a drain line, and
   wherein said distributed capacitive coupling is arranged between one of said lines of a first one of said distributed amplifiers and one of said lines of a second one of said distributed amplifiers, and output signals having a quadrature phase difference between them are taken from said drain line of the first distributed amplifier and the drain line of the second distributed amplifier.

9. A circuit for splitting an input signal into output signals according to claim 8, further comprising a third distributed amplifier of like construction as said pair of distributed amplifiers, wherein another distributed capacitive coupling is arranged between the other one of said lines of the second distributed amplifier and one of said lines of the third distributed amplifier, and output signals having an opposing phase difference between them are taken from said drain line of the first distributed amplifier and the drain line of the third distributed amplifier.

10. An active-type broadband power divider comprising:
   a pair of distributed amplifies which are coupled together by a distributed capacitive coupling to provide a predetermined phase shift between respective output signals thereof,
   wherein said distributed amplifiers are each implemented in the form of a row of three-terminal transistors having their gate terminals connected to a gate line and their drain terminals connected to a drain line, wherein said distributed capacitive coupling is arranged between the drain line of a first one of said pair of distributed amplifiers and the gate line of a second one of said pair of distributed amplifiers, and wherein the output signals taken from the drain lines of the respective distributed amplifiers have a 90 degree phase difference between them.

11. An active-type broadband power divider according to claim 10, further comprising a third distributed amplifier of like construction as said pair of distributed amplifiers, wherein a second distributed capacitive coupling couples a drain line of the second distributed amplifier to a gate line of the third distributed amplifier, and the output signals taken from the drain line of the first distributed amplifier and from the drain line of the third distributed amplifier have a 180 degree phase difference between them.

12. A circuit for splitting an input signal into output signals having a predetermined phase shift between them comprising:

a pair of distributed amplifiers which are coupled together by a distributed capacitive coupling, wherein said distributed amplifiers are each implemented in the form of a row of three-terminal transistors having their gate terminals connected to a gate line and their drain terminals connected to a drain line, and wherein said distributed capacitive coupling is arranged between one of said lines of a first one of said distributed amplifiers and one of said lines of a second one of said distributed amplifies, and output signals having a quadrature phase difference between them are taken from said drain line of the first distributed amplifier and the drain line of the second distributed amplifier, and further comprising a third distributed amplifier of like construction as said pair of distributed amplifiers, wherein another distributed capacitive coupling is arranged between the other one of said lines of the second distributed amplifier and one of said lines of the third distributed amplifier, and output signals having an opposing phase difference between them are taken from said drain line of the first distributed amplifier and the drain line of the third distributed amplifier.

13. An active-type broadband power divider comprising:

a pair of distributed amplifiers which are coupled together by a distributed capacitive coupling to provide a predetermined phase shift between respective output signals thereof, wherein said distributed amplifiers are each implemented in the form of a row of three-terminal transistors having their gate terminals connected to a gate line and their drain terminals connected to a drain line, and wherein said distributed capacitive coupling is arranged between the gate line of a first one of said pair of distributed amplifiers and the gate line of a second one of said pair of distributed amplifiers.

14. An active-type broadband power divider according to claim 13, wherein the output signals taken from the drain lines of the respective distributed amplifiers have a 90 degree phase difference between them.

15. An active-type broadband power divider according to claim 13, further comprising a third distributed amplifier of like construction as said pair of distributed amplifiers, wherein a second distributed capacitive coupling couples a drain line of the second distributed amplifier to a gate line of the third distributed amplifier, and the output signals taken from the drain line of the first distributed amplifier and from the drain line of the third distributed amplifier have a 180 degree phase difference between them.

16. An active-type broadband power divider according to claim 13, wherein said power divider has a quadrature phase shift characteristic between output signals with a phase shift error of less than 5% obtained over a broad bandwidth.

17. An active-type broadband power divider according to claim 13, wherein said power divider has a quadrature phase shift characteristic between output signals which is substantially even over a decade bandwidth.

18. An active-type broadband power divider according to claim 13, wherein said distributed capacitive coupling is obtained by discrete capacitors.

19. An active-type broadband power divider according to claim 13, wherein said distributed capacitive coupling is obtained by a capacitive coupling between the transmission lines.

* * * * *